(12) United States Patent
Hsiao et al.

(10) Patent No.: US 7,005,701 B2
(45) Date of Patent: Feb. 28, 2006

(54) METHOD FOR FABRICATING A VERTICAL NROM CELL

(75) Inventors: Ching-Nan Hsiao, Kaohsiung Hsien (TW); Chi-Hui Lin, Taipei (TW); Chung-Lin Huang, Taichung (TW); Ying-Cheng Chuang, Bade (TW)

(73) Assignee: Nanya Technology Corporation, Taoyuan (TW)

( * ) Notice: Subject to any disclaimer, the term of this patent is extended or adjusted under 35 U.S.C. 154(b) by 44 days.

(21) Appl. No.: 10/318,551

(22) Filed: Dec. 13, 2002

(65) Prior Publication Data

US 2004/0094781 A1 May 20, 2004

(30) Foreign Application Priority Data

Nov. 18, 2002 (TW) .............................. 91133597 A

(51) Int. Cl.
*H01L 29/76* (2006.01)
*H01L 39/94* (2006.01)
*H01L 31/062* (2006.01)
*H01L 31/113* (2006.01)
*H01L 31/119* (2006.01)

(52) U.S. Cl. .................. 257/328; 257/327; 257/329; 257/331; 257/332

(58) Field of Classification Search ........ 257/327–334; 438/259, 270, 271, 589
See application file for complete search history.

(56) References Cited

U.S. PATENT DOCUMENTS

| | | | | |
|---|---|---|---|---|
| 5,460,988 A | * | 10/1995 | Hong | 438/259 |
| 5,460,989 A | * | 10/1995 | Wake | 438/259 |
| 5,552,620 A | * | 9/1996 | Lu et al. | 257/302 |
| 5,595,927 A | * | 1/1997 | Chen et al. | 438/270 |
| 5,703,387 A | * | 12/1997 | Hong | 257/315 |
| 5,998,261 A | * | 12/1999 | Hofmann et al. | 438/257 |
| 6,008,079 A | * | 12/1999 | Wu | 438/175 |
| 6,022,779 A | | 2/2000 | Shin et al. | |
| 6,180,979 B1 | * | 1/2001 | Hofmann et al. | 257/329 |
| 6,191,459 B1 | * | 2/2001 | Hofmann et al. | 257/390 |
| 6,376,313 B1 | * | 4/2002 | Goebel et al. | 438/270 |
| 6,486,028 B1 | * | 11/2002 | Chang et al. | 438/259 |
| 6,555,870 B1 | * | 4/2003 | Kirisawa | 257/324 |
| 6,670,246 B1 | * | 12/2003 | Hsiao et al. | 438/276 |
| 2002/0196663 A1 | * | 12/2002 | Kuo | 365/185.18 |

* cited by examiner

*Primary Examiner*—Tom Thomas
*Assistant Examiner*—Jesse A. Fenty
(74) *Attorney, Agent, or Firm*—Quintero Law Office

(57) ABSTRACT

A method for fabricating a vertical nitride read-only memory (NROM) cell. A substrate having at least one trench is provided. A spacer is formed over the sidewall of the trench. Subsequently, ion implantation is performed on the substrate using the spacer as a mask to form doping areas as bit lines in the substrate near its surface and the bottom of the trench. Bit line oxides are formed over each of the doping areas. After the spacer is removed, a conformable insulating layer as gate dielectric is deposited on the sidewall of the trench and the surface of the bit line oxide. Finally, a conductive layer as a word line is deposited over the insulating layer and fills in the trench.

7 Claims, 5 Drawing Sheets

METHOD FOR FABRICATING A VERTICAL NROM CELL

BACKGROUND OF THE INVENTION

1. Field of the Invention

The present invention relates in general to a non-volatile memory cell and method for fabricating the same. More particularly, it relates to a vertical nitride read-only memory (NROM) cell and method for fabricating the same.

2. Description of the Related Art

In the non-volatile memory industry, the development of nitride read-only memory (NROM) started in 1996. The new non-volatile memory technology utilizes oxide-nitride-oxide (ONO) gate dielectric and known mechanisms of program and erase to create two separate bits per cell. Thus, the NROM bit size is half of the cell area. Since silicon die size is the main element in the cost structure, it is apparent why the NROM technology is considered an economical breakthrough.

FIG. 1 is a cross-section showing a conventional NROM cell structure. This cell includes a silicon substrate 100 which has two separated bit lines (source and drain) 102, two bit line oxides 104 formed over each of the bit lines 102, respectively, and an ONO layer 112 having a silicon nitride layer 108 sandwiched between bottom silicon oxide layer 106 and top silicon oxide layer 110 formed on the substrate 100 between bit line oxides 102. A gate conductive layer 114 (word line) lies on the top of the bit line oxides 104 and the ONO layer 112.

The silicon nitride layer 108 in the ONO structure 112 has two chargeable areas 107 and 109 adjacent to the bit lines 102. These areas 107 and 109 are used for storing charges during memory cell programming. To program the left bit close to area 107, left bit line 102 is the drain and receives the high programming voltage. Simultaneously, right bit line 102 is the source and is grounded. The opposite is true for programming area 109. Moreover, each bit is read in a direction opposite its programming direction. To read the left bit, stored in area 107, left bit line 102 is the source and right bit line 102 is the drain. The opposite is true for reading the right bit, stored in area 109. In addition, the bits are erased in the same direction that they are programmed.

Increasing cell density for integration of ICs requires reducing the bit line area or shrinking the width of the ONO layer. Unfortunately, reducing bit line area may increase the resistance of the bit line, and results in lowered operating speed of the memory cell. In addition, shrinking the gate length may induce cell disturbance during program, erase, or read, in particular, when width of the gate length is less than 10 nm. Therefore, the cell density is limited.

SUMMARY OF THE INVENTION

Accordingly, an object of the invention is to provide a novel vertical nitride read-only memory (NROM) cell and method for fabricating the same, which uses the sidewall of the substrate trench as a channel of the NROM cell, reducing the resistance of bit lines by increasing bit line width.

Another object of the invention is to provide a novel vertical NROM cell and method for fabricating the same to form a vertical channel instead of the conventional planar one, thereby preventing the cell disturbance during program, read, and erase.

According to one aspect, the invention provides a method for fabricating a vertical NROM cell. First, a substrate having at least one trench is provided. A spacer is formed over the sidewall of the trench. Subsequently, ion implantation is performed in the substrate using the spacer as a mask to form doping areas as bit lines in the substrate near its surface and the bottom of the trench. Bit line oxides are formed over each of the doping areas. After the spacer is removed, a conformable insulating layer as gate dielectric is deposited on and in direct contact with the substrate surface that constitutes the sidewalls of the trench and the surface of the bit line oxide. Finally, a conductive layer as a word line is deposited over the insulating layer and fills in the trench.

According to another aspect, the invention provides a vertical NROM cell. The memory cell includes a substrate having at least one trench, bit lines, bit line oxides, a gate dielectric layer, and a word line. The bit lines are formed in the substrate near its surface and the bottom of the trench. Each of the bit line oxides is disposed over each of the bit lines. The gate dielectric layer is conformably formed on and in direct contact with the substrate surface that constitutes the sidewalls of the trench and the surface of the bit line oxide. The word line is disposed over the gate dielectric layer and fills in the trench.

The bit lines are formed by phosphorus ion implantation, and the bit line oxides are formed by thermal oxidation. Moreover, the gate dielectric layer is an oxide-nitride-oxide (ONO) layer, and the word line is polysilicon.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE INVENTION

A preferred embodiment of the present invention is now described with reference to FIGS. 2a–2f and 3.

Figure 1:
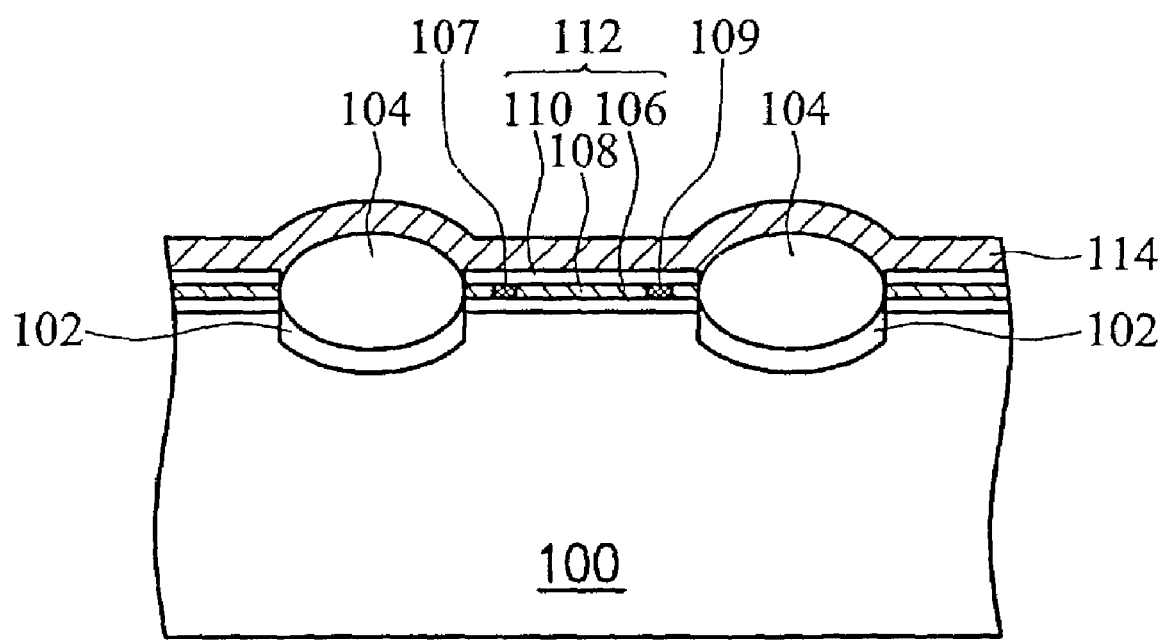
FIG. 1 is a cross-section showing a conventional NROM cell structure.
Figure 2A:
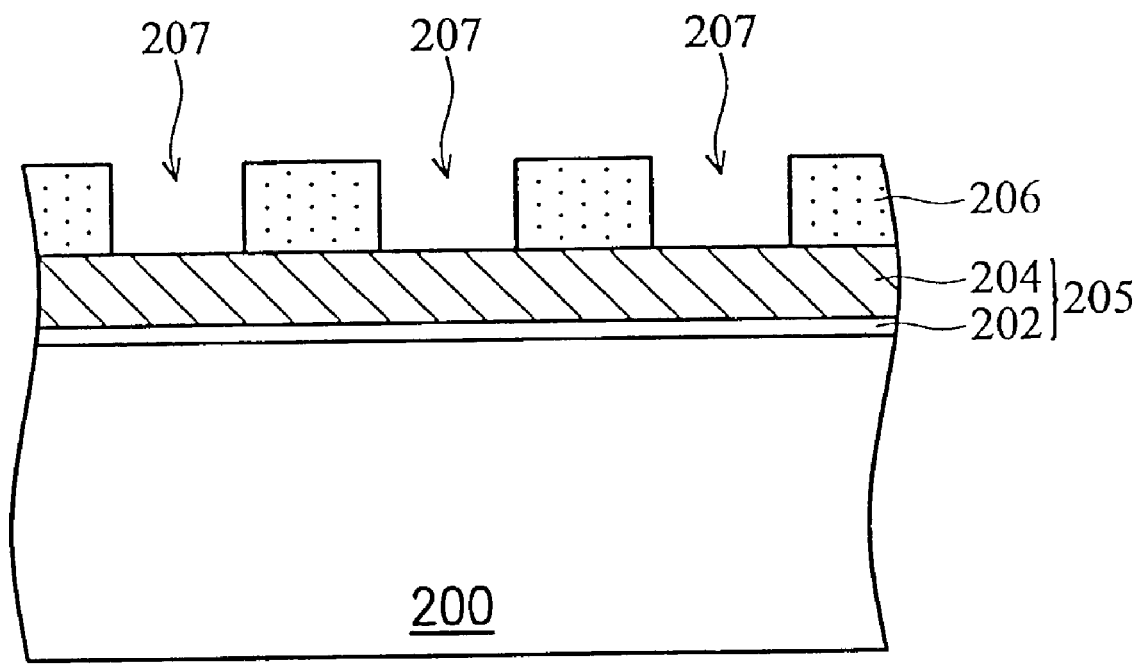
FIGS. 2a–2f are cross-sections showing a method for fabricating a vertical NROM cell according to the present invention.

FIGS. 2a–2f illustrate a method for fabricating a vertical nitride read-only memory (NROM) cell of the invention. First, in FIG. 2a, a substrate 200, such as a silicon substrate, is provided. A mask layer 205 is formed on the substrate 200. The mask layer 205 can be a single layer or a plurality of layers. As shown in FIG. 2a, the mask layer 205 is preferably composed of a pad oxide layer 202 and a thicker silicon nitride layer 204. In this invention, the pad oxide layer 202 has a thickness of about 100 Å and can be formed by thermal oxidation or conventional CVD, such as atmospheric pressure CVD (APCVD) or low pressure CVD (LPCVD). The silicon nitride layer 204 overlying the pad oxide layer 202 has a thickness of about 1000~2000 Å and can be formed by LPCVD using $SiCl_2H_2$ and $NH_3$ as reaction source. Next, a photoresist layer 206 is coated on the mask layer 205. Thereafter, lithography is performed on the photoresist layer 206 to form openings 207 inside.

Figure 2B:
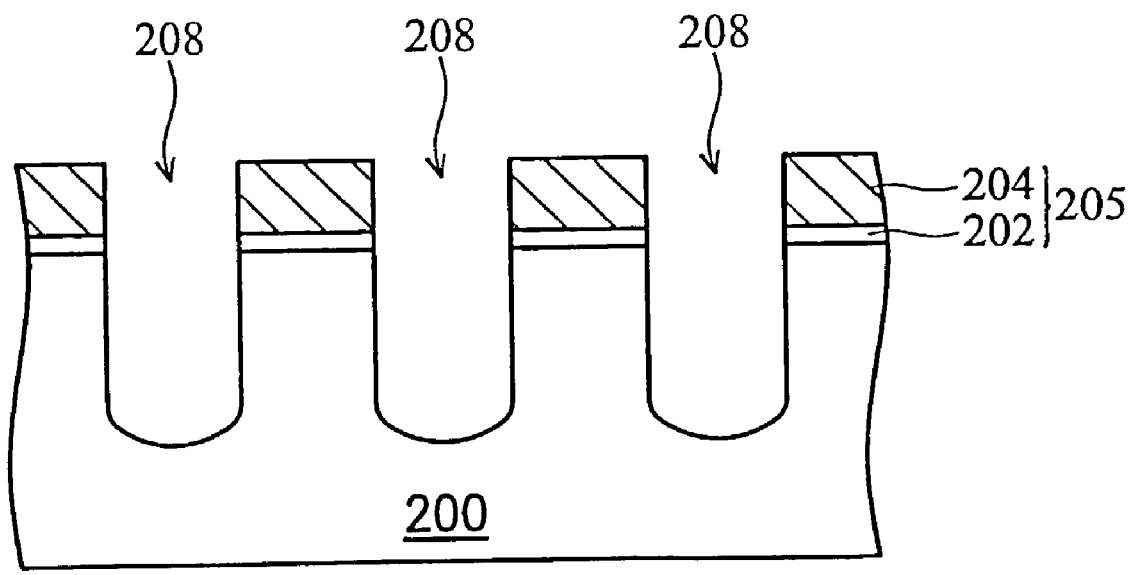

Next, in FIG. 2b, the photoresist layer 206 is used as a mask to anisotropically etch the mask layer 205, using, for example, reactive ion etching (RIE), to transfer the pattern of the photoresist layer 206 to the mask layer 205. Thereafter, suitable wet etching or ashing is performed to remove photoresist layer 206. Subsequently, anisotropic etching is performed using the mask layer 205 as an etch mask, using, for example, RIE. The silicon substrate 200 under these openings is etched to a predetermined depth, such as 1400~1600 Å, to form trenches 208 in the silicon substrate 200.

Figure 2C:
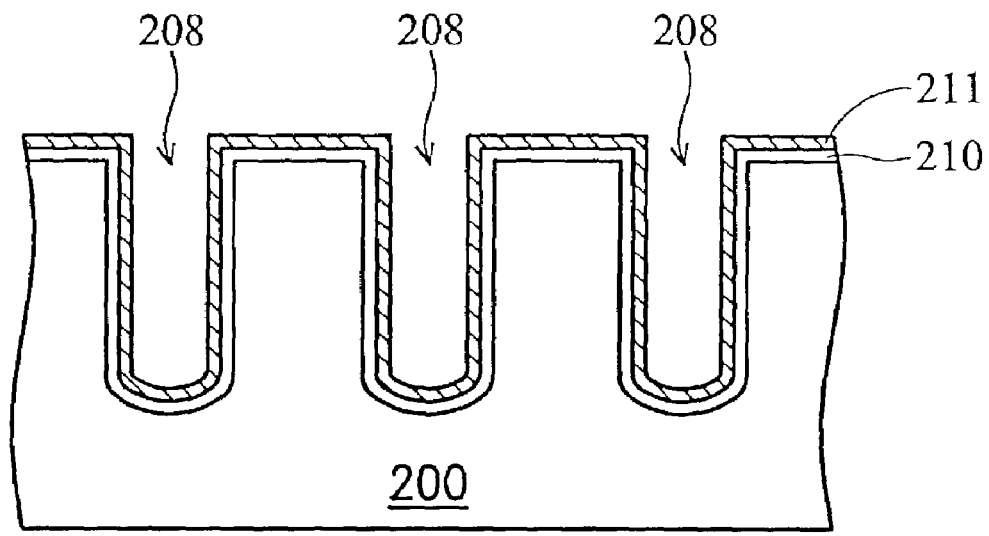

Next, in FIG. 2c, the mask layer 205 is removed. The method of removing the silicon nitride layer 204, can, for example use soaking with hot $H_3PO_4$, and the method of removing pad oxide layer 202 can, for example, be soaking with HF liquid. Thereafter, a conformable oxide layer 210, which has a thickness of about 100 Å, is formed over the substrate 200 and the surface of the trenches 208 by CVD. This thin oxide layer 210 is used for repairing defects (not shown) formed in the substrate 200 during etching of trenches 208. Next, a conformable silicon nitride layer 211 is deposited over the silicon oxide layer 210. Also, this layer 211 can be formed by LPCVD using $SiCl_2H_2$ and $NH_3$ as reaction source.

Figure 2D:
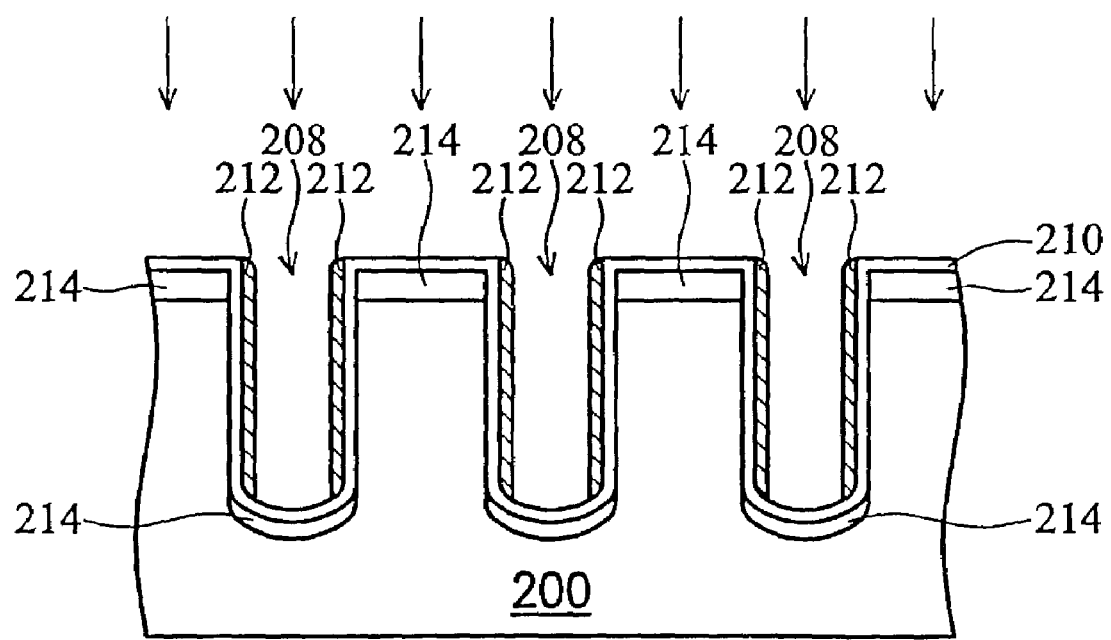

Next, in FIG. 2d, anisotropic etching, such as RIE, is performed to form a spacer 212 over the sidewall of each trench 208. Thereafter, a typical ion implantation, such as phosphorus, is performed in the bottom of the trenches 208 and the surface of the substrate 200 using the spacers 212 as masks. As a result, doping areas 214 are formed in the substrate 200 near its surface and the bottom of the trenches 208 to serve as bit lines.

Figure 2E:
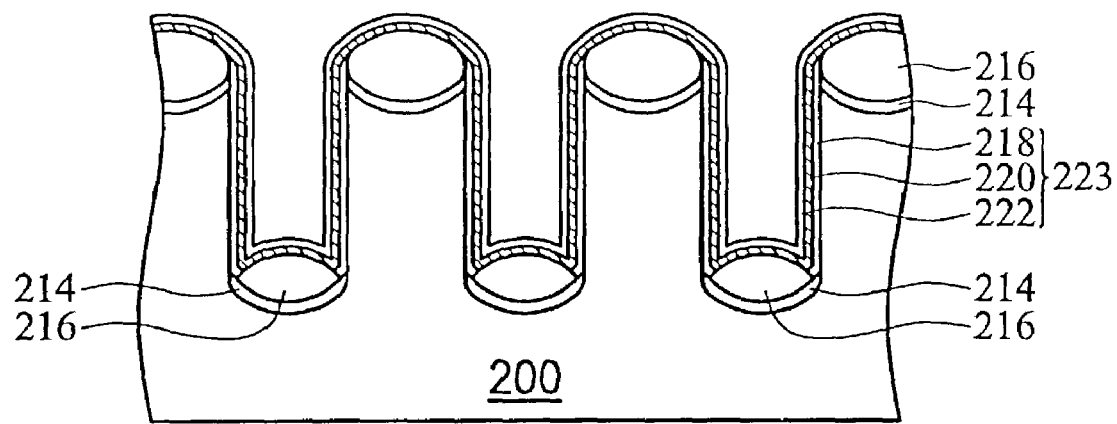

Next, in FIG. 2e, bit line oxides 216 are thermally grown over each of the doping areas 214. The bit line oxides 216 are usually very thick, thereby lowering the bit line capacitance. In this invention, the bit line oxides 216 have a thickness of about 500~700 Å. Thereafter, the spacers 212 and the silicon oxide layer 210 are successively removed by wet etching as well as removing the mask layer 205.

Next, a conformable insulating layer 223, such as an oxide-nitride-oxide (ONO) layer, is formed on the sidewall of the trenches 208 and the surface of the bit line oxides 216 to serve as gate dielectric. In this invention, the ONO layer 223 has a silicon nitride layer 220 sandwiched between two silicon oxide layers 218 and 222. The silicon nitride layer 220 and the silicon oxide layers 218 and 222 have a thickness of about 30~100 Å, respectively. Moreover, the silicon oxide layer 218 can be formed by thermal oxidation. The silicon nitride layer 220 and the silicon oxide layer 222 can be formed by CVD. As mentioned above, the silicon nitride layer 220 in the ONO layer 223 is used for storing charges during memory cell programming. Unlike the prior art, in the invention, the substrate 200 of the sidewall of the trenches 208 serves as a vertical channel for memory cell.

Figure 2F:
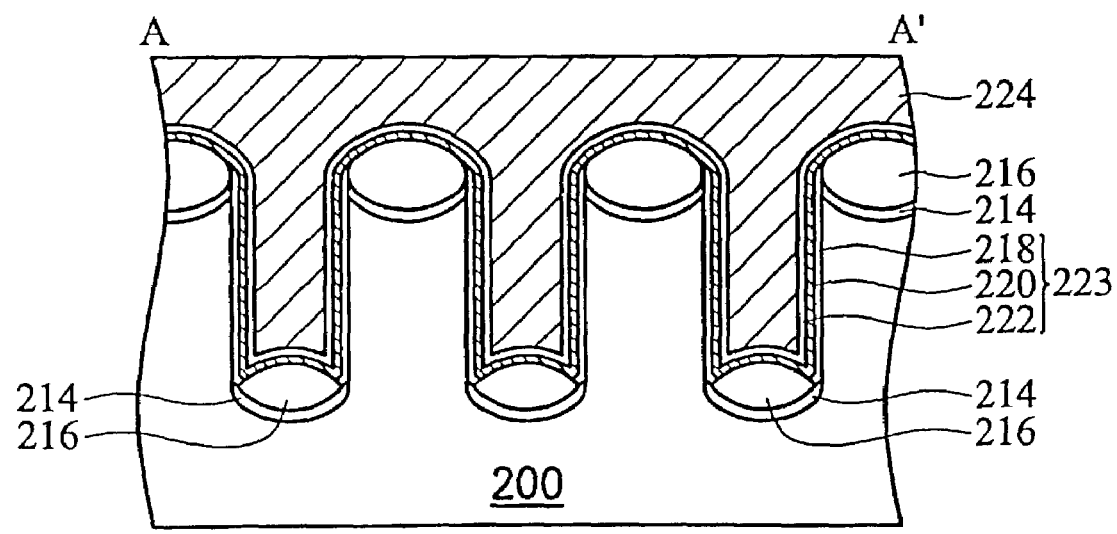
Figure 3:
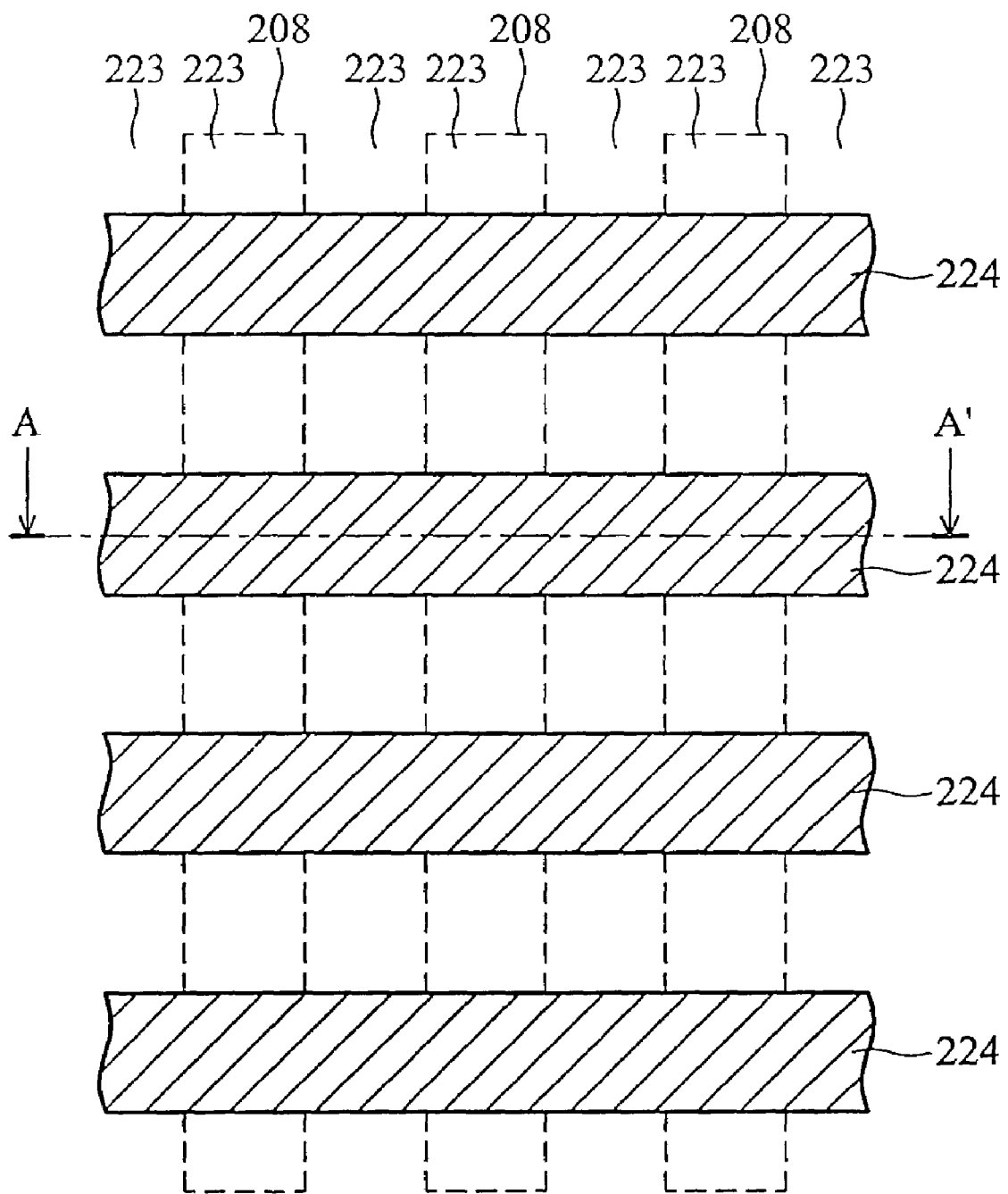
FIG. 3 is a plane view of the vertical NROM cell in FIG. 2f.

Finally, in FIG. 2f, a conductive layer 224, such as polysilicon, is formed over the insulating layer 223 and fills in the trenches 20B completely. The conductive layer 224 can be formed by CVD and has a thickness of about 1500~2000 Å. Thereafter, the conductive layer 224 can be planarized by chemical mechanical polishing (CMP). Next, a photoresist layer (not shown) is coated on the conductive layer 224. Lithography and etching are successively performed on the conductive layer 224, thereby defining a word line. Thus, the vertical NROM cell according to the invention is completed after the photoresister layer is removed. FIG. 3 illustrates a plane view of the vertical NROM cell in FIG. 2f.

Also, FIG. 2f illustrates a cross-section of a vertical NROM cell structure according to the invention. The cell includes a substrate 200 having a plurality of trenches 208, and bit lines 214 formed in the substrate 200 near its surface and the bottom of the trenches 208. In the invention, the trenches 208 have a depth of about 1400~1600 Å. Moreover, the bit lines 214 are formed by phosphorus ion implantation. Bit line oxides 216, which have a thickness of about 500~700 Å, are disposed over each of the bit lines 214. The bit line oxides 216 can be formed by thermal oxidation. A gate dielectric layer 223, which includes a silicon nitride layer 220 sandwiched between two silicon oxide layers 218 and 220 to create an ONO structure, is conformably formed on the sidewall of the trenches 208 and the surface of the bit line oxides 216. A word line 224, such as polysilicon, is disposed over the gate dielectric 223 and fills in the trenches 208.

Compared with the prior art, the NROM cell of the invention has a vertical channel which can prevent the cell disturbance due to the suitable channel length. That is, the length of the channel is based on the depth of the trench. As long as the depth of the trench is deep enough, the cell disturbance can be avoided. Moreover, since the channel of the NROM cell is located in the sidewall of the substrate trench, the entire plane of the substrate can be used for forming bit lines by ion implantation. That is, the bit line area can be increased to reduce the resistance of the bit line, thereby increasing the operating speed of the NROM.

The foregoing description has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A vertical nitride read-only memory (NROM) cell, comprising:
    a substrate having at least one trench;
    bit lines formed in the substrate near its surface adjacent to the trench and near the bottom of the trench;
    bit line oxides disposed over each of the bit lines;
    a gate dielectric layer conformably formed on and in direct contact with the substrate surface that constitutes sidewalls of the trench and the surface of the bit line oxide; and
    a word line disposed over the gate dielectric and filled in the trench.

2. The cell as claimed in claim 1, wherein the trench has a depth of about 1400~1600 Å.

3. The cell as claimed in claim 1, wherein the bit lines are formed by phosphorus ion implantation.

4. The cell as claimed in claim 1, wherein the bit line oxides are formed by thermal oxidation.

5. The cell as claimed in claim 1, wherein the bit line oxides have a thickness of about 500~700 Å.

6. The cell as claimed in claim 1, wherein the gate dielectric layer is an oxide-nitride-oxide layer.

7. The cell as claimed in claim 1, wherein the word line is polysilicon.

* * * * *